United States Patent [19]
Buckley, III et al.

[11] Patent Number: 5,477,082
[45] Date of Patent: Dec. 19, 1995

[54] BI-PLANAR MULTI-CHIP MODULE

[75] Inventors: Frederick Buckley, III; James S. Blomgren, both of San Jose, Calif.

[73] Assignee: Exponential Technology, Inc., San Jose, Calif.

[21] Appl. No.: 179,904

[22] Filed: Jan. 11, 1994

[51] Int. Cl.$^6$ .......................... H01L 23/12; H01L 23/488
[52] U.S. Cl. .......................... 257/679; 257/700; 257/723; 257/778
[58] Field of Search .................................. 257/723, 724, 257/768, 778, 779, 679, 700, 703

[56] References Cited

U.S. PATENT DOCUMENTS

| | | | |
|---|---|---|---|
| 4,535,219 | 8/1985 | Sliwa, Jr. | 219/121 LC |
| 4,740,868 | 4/1988 | Hawkins | 361/421 |
| 4,893,172 | 1/1990 | Matsumoto et al. | 357/79 |
| 4,943,844 | 7/1990 | Oscilowski et al. | 357/74 |
| 4,949,224 | 8/1990 | Yamamura et al. | 361/412 |
| 5,182,632 | 1/1993 | Bechtel et al. | 257/713 |
| 5,205,035 | 4/1993 | DiAngelo et al. | 29/837 |
| 5,208,729 | 5/1993 | Cipolla et al. | 361/382 |
| 5,238,176 | 8/1993 | Nishimura | 228/256 |
| 5,243,141 | 9/1993 | Yonehara | 174/260 |
| 5,244,833 | 9/1993 | Gansuage et al. | 437/183 |
| 5,252,857 | 10/1993 | Kane et al. | 257/686 |
| 5,268,815 | 12/1993 | Cipolla et al. | 361/704 |

FOREIGN PATENT DOCUMENTS

| | | | |
|---|---|---|---|
| 0035461 | 2/1984 | Japan | 257/666 |
| 0211663 | 9/1988 | Japan | 257/724 |
| 0071648 | 3/1991 | Japan | 257/700 |

OTHER PUBLICATIONS

"Area Array TAB Package Technology", by Andros and Hammer, ITAP proceedings, 1993.
"Area Array TAB" brochure, IBM?, 1993?.

*Primary Examiner*—William Mintel
*Assistant Examiner*—Peter Toby Brown
*Attorney, Agent, or Firm*—Stuart T. Auvinen

[57] ABSTRACT

A bi-planar multi-chip package has die mounted on both sides of an insulating flexible carrier. The die are located in two parallel planes, with the flexible carrier located on a third plane between the two die planes. The die are mounted with the active circuit area facing each other on opposing sides of the flexible carrier. The carrier has conductive layers forming interconnect traces on both sides, and through-vias for connecting traces on opposite sides. The opposing die are mounted to the carrier with a solder-bump process with opposing pads located directly opposite each other. Vias are located in close proximity to the pads, between adjacent pads on the flexible carrier. Because the vias are between two adjacent pads, the interconnect length between two pads is on the order of the pad pitch. Thus opposing pads on the two die may be connected through the adjacent via with a small interconnect length.

13 Claims, 7 Drawing Sheets

Fig. 1: Prior Art

BI-PLANAR MULTI-CHIP MODULE

BACKGROUND OF THE INVENTION—FIELD OF THE INVENTION

This invention relates to Integrated Circuit (IC) Packaging, and more particularly to IC packages with multiple silicon die.

BACKGROUND OF THE INVENTION—DESCRIPTION OF THE RELATED ART

As the manufacturing cost of silicon integrated circuits (IC's) has decreased, the packaging costs have become a more significant portion of the overall cost of IC devices. Shrinking device technology has allowed for much greater integration of system functions on a single silicon die. However, this greater integration has also led to a need for a greater number of interconnects as more input/output (I/O) signals are needed for communication with the rest of the system.

Traditional packaging technology used a single ring of bonding pads around the perimeter of the silicon die. This die was attached within a cavity in the package and very small wires were connected to the bonding pads while the other end of the wires were attached to larger pads or leads on the package. The leads on the package were also located in a single ring around the die cavity. This essentially one-dimensional interconnect scheme was very limited in the number of I/O pads available; the technology has been pushed to the 200-interconnect level by shrinking the distance between adjacent pads and increasing the size of the silicon die and the package cavity.

An increase in I/O count was accomplished by a "two-dimensional" approach: rather than have a single ring of bonding pads, several successively-smaller rings were arrayed inside one another on the die, resulting in an array of pads. However, conventional wire-bonding was not feasible since the wires would cross over or touch one another to reach the inner ring of pads. Instead, a solder ball was attached to each bonding pad, and an identical array of pads was placed on the package inside the cavity. The die was placed into the cavity, with the bonding pads facing down, and directly over the lead or carrier pads on the package. Thus, when heated the solder balls on the bonding pads would create a solder bond to the package carrier pads. A non-conducting epoxy encapsulant was placed between the soldered pads for added strength and protection. This process results in I/O densities up to 700 signals. The package itself can similarly be attached to a printed circuit (PC) card or board by placing larger solder balls on package leads for attachment to leads on the PC card. More detail on this process, known as Solder Attach Tape Technology (SATT) can be found in U.S. Pat. No. 5,205,035 and 5,238,176 assigned to International Business Machines of Armonk, N.Y.

It is often desired to include several silicon die in the same package. This can be advantageous if the die have high interconnection requirements with other die in the module, but less interconnection with the rest of the system outside the module. Thus the interconnection between die will be entirely within the module, resulting in shorter interconnect lengths and shorter interconnect delays because of the lower capacitive loading of the shorter interconnect. In addition, the output pad drivers on the die may be made smaller since a smaller capacitive load is driven. Originally called "multi-chip modules" employing standard wire bonding, multi-chip modules can also be produced with the solder ball technology.

However, the multi-chip modules arrange the silicon die in a two-dimensional fashion, as FIG. 1 shows. Silicon die 10, 12 are mourned on flexible carrier 14 of multi-chip module 8. Module 8 is itself mounted on PC card 16 using a solder ball technology with large solder balls 18 forming the electrical connection. Small solder balls or bumps 20 attach die 10 and 12 to flexible carrier 14. Interconnect traces are formed on both sides of flexible carrier 14, while vias connect traces on either side of the flexible carrier. Trace 24 is a typical interconnect trace between silicon die 10 and die 12, and includes vias 22, 23. A typical interconnection trace 24 between the two die must be about as long as the size of the die 10, 12 because the die both lie in the same plane. The average length of interconnect traces between die 10 and 12 is shown as length "A" in FIG. 1.

While average interconnect distance "A" in this monoplanar type of multi-chip module is much less than the interconnect distance between two die mounted in separate packages, what is desired is an even smaller interconnect distance as provided by the invention.

SUMMARY OF THE INVENTION

A bi-planar multi chip package has a top die and a bottom die, with the active areas and bonding pads of the two die facing each other. An insulating flexible carrier with an overlapping portion situated between the die has a top and a bottom conductive layer patterned with carrier terminal pads. Vias in the carrier connect carrier terminal pads on the top conductive layer with carrier terminal pads on the bottom conductive layer. The carrier terminal pads on the top conductive layer are bonded to bonding pads on the top die while carrier terminal pads on the bottom conductive layer are bonded to bonding pads on the bottom die. An overlapping portion of the flexible carrier is between the top and bottom die, and the overlapping portion has carrier terminal pads on the top and bottom layers that are bonded to the bonding pads on the top and bottom die. This overlapping portion of the carrier has vias connecting the carrier terminal pads on the top and bottom layers. These vias are slightly offset from and in close proximity to the carrier terminal pads. Because the vias are between two adjacent pads, the interconnect length is on the order of the pad pitch rather than the length of the entire die. Thus opposing bonding pads on the two die facing each other may be connected through the adjacent via with a small interconnect length.

DETAILED DESCRIPTION

Figure 2:
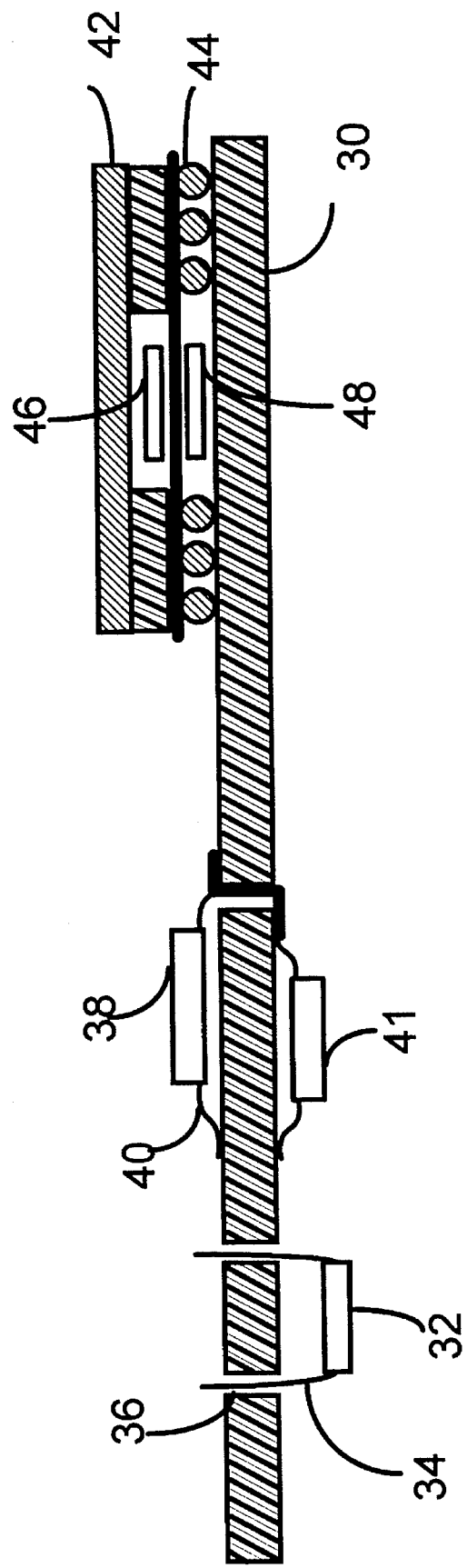
FIG. 2 is a cross-sectional diagram of a typical printed circuit (PC) card.

FIG. 2 is a cross-sectional diagram of a typical printed circuit (PC) card 30. PC card 30 has mounted thereon many different components, such as packaged IC's, capacitors, resistors, and connectors. IC package 32 is of the older style that has leads 34 that are placed in through-vias 36 through PC card 30. Newer IC packages such as package 38 use surface mount technology (SMT). Leads 40 of surface mount package 38 bend upwardly and mount directly onto card 30, without the need for vias. Thus IC packages 38, 41 may be mounted on both sides of card 30 without regard to packages mounted on the other side of the card 30. Package 41 is thus mounted without regard to package 38. Card 30 also has mounted thereon multi-chip package or module 42. Package 42 is mounted using solder ball technology, with connection made by solder balls 44. Silicon die 46, 48 within module 42 are interconnected to each other and to solder balls 44.

Current PC cards may have several layers of traces or interconnect on both sides of the card. The PC card is stiff and rigid, being about 1/16 to 1/8 of an inch in thickness.

Vias provide connection between the different conductive layers. However, the large size of the PC card does not facilitate directly mourning silicon die thereon because silicon die require very fine geometry for interconnects. If the fine geometry is available on a card, the entire card must be manufactured to this geometry requirement, not just the area in proximity to the die. Thus the card manufacturing cost would increase prohibitively if die were mounted directly on a PC card.

Figure 3:
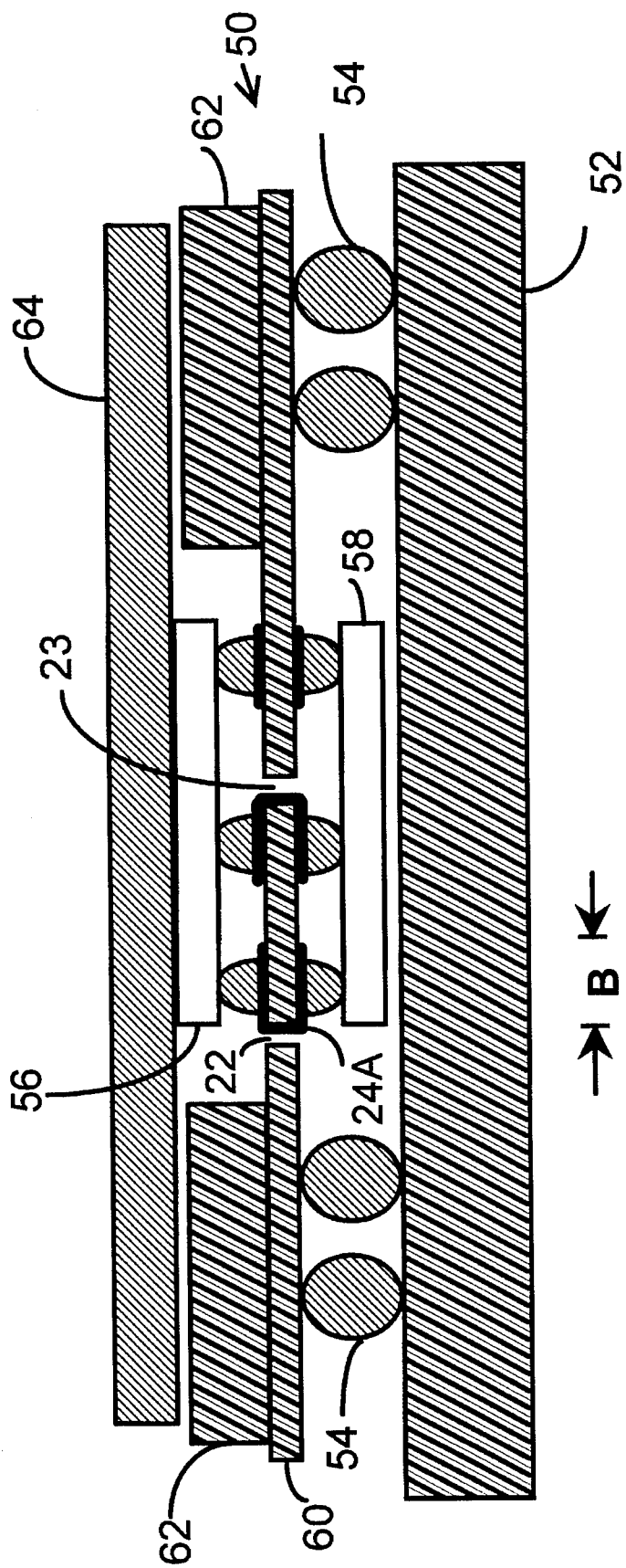
FIG. 3 is a side view of the bi-planar multi-chip module.

FIG. 3 is a cutaway side view of the bi-planar multi-chip module 50 mourned on a PC card 52. Module 50 is mourned on PC card 52 using the solder ball technology. Solder balls 54 are arranged in an outer ring or ball grid array encircling the silicon dice 56, 58. Flexible carrier 60 is preferably made from an insulator such as Polyimide, which is a good dielectric. Flexible carrier 60 has layers of copper interconnect 24A patterned on both sides, and through-hole vias 22, 23 for connecting traces on either side. A stiffener 62 made from copper is placed above the solder ball array 54 and surrounds the module 50. A heat sink 64 may be attached to the die 56 using thermal adhesive, or attached to die 56 and stiffener 62, or a non-heat-conducting covering may be used to form the top surface of the module, or no rigid covering. An encapsulant such as epoxy (not shown) is placed around die 56, 58 to provide mechanical strength and reliability. Heat sink 64 may conduct heat away from not only the top die 56, but also bottom die 58, by means of the metal bonding pads and connections between the two die. The large number of interconnect between the two die 56, 58 greatly increases heat transfer between the two die 56, 58, resulting in a more reliable package.

Figure 4:
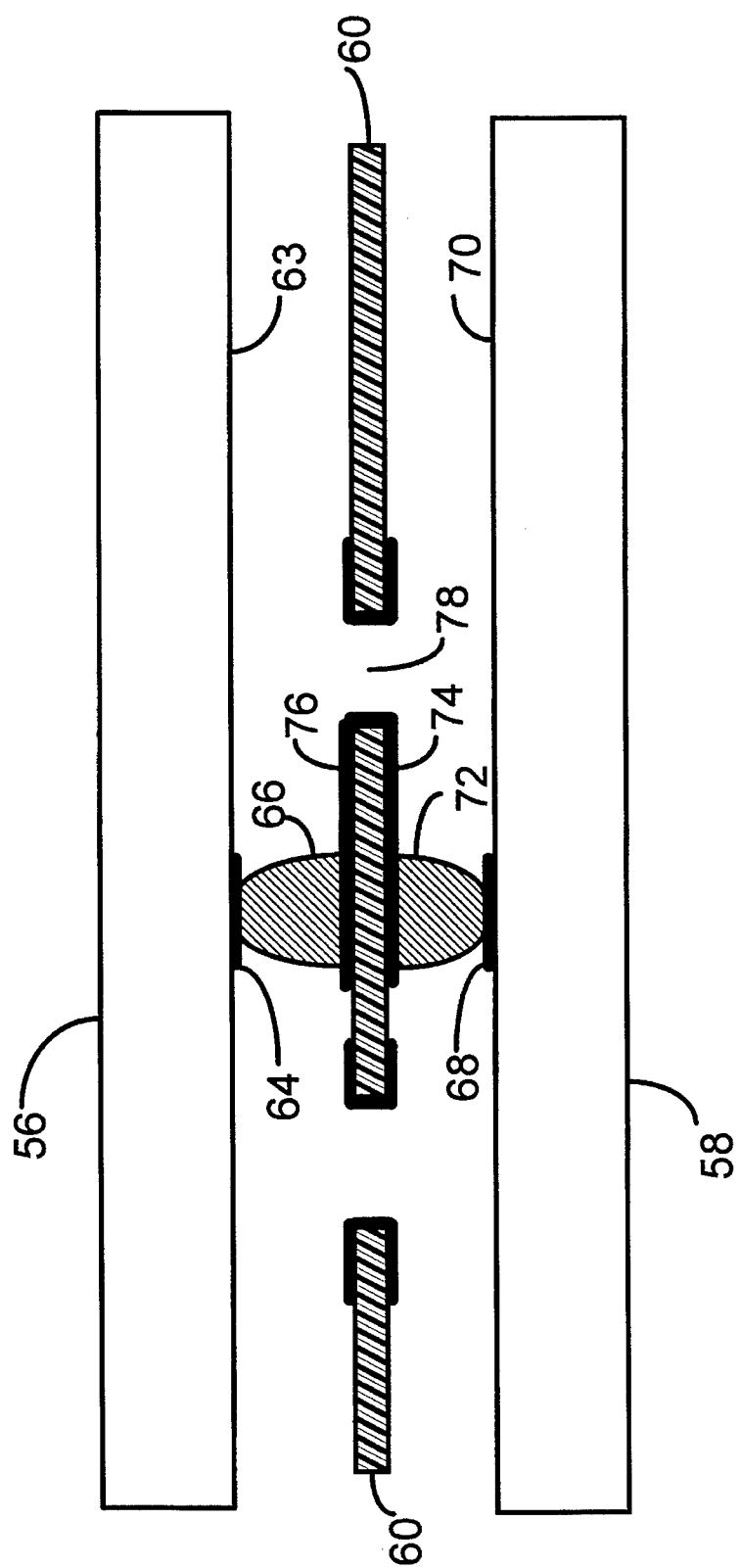
FIG. 4 is a cross sectional detail of the module through section "A—A" of FIG. 5.

FIG. 4 shows a detailed cross-section of the module where the two die 56, 58 are attached to flexible carrier 60. Each die 56, 58 contains an array of concentric rectangles or rings of bonding pads 64, 68 around the periphery of the die. The arrangement of bonding pads on the two die are preferably similar or mirror-images of one another so that bonding pads on each die will line up opposite one another when the two die are mounted facing one another on carrier 60, as shown in FIG. 4. Die 56 has active side 63, the active side being the side on which transistors and other electrical devices are patterned. Bonding pad 64 is one of many located on active side 63 of die 56. A solder bump 66 is formed on bonding pad 64 during or after processing of the silicon die. Likewise, die 58 has bonding pad 68 formed on active side 70, and bonding pad 68 also has a solder bump 72 formed thereon.

Die 56, 58 are attached to flexible carrier 60 by heating the solder bumps and attaching them to carrier pad locations 74, 76 patterned in the copper interconnect layers on both sides of flexible carrier 60. Via 78 is located near to pad locations 74, 76, within the array of solder bumps and bonding pads. Conductive metal, preferably the same copper used for interconnect layers on the flexible carrier, is formed on the sidewalls of vias, including via 78. Thus a conductive path through the flexible carrier is achieved in close proximity to the bonding pads. A very short conductive path is thus made from bonding pad 64 on die 56 to bonding pad 68 on die 58, through solder bumps 66, 72, carrier pad locations 74, 76, and via 78. Since the carrier pads are in close proximity to the connecting via, typically at least 1 but less than 4 pad diameters away, the interconnect length is only 2–8 pad diameters.

Figure 5:
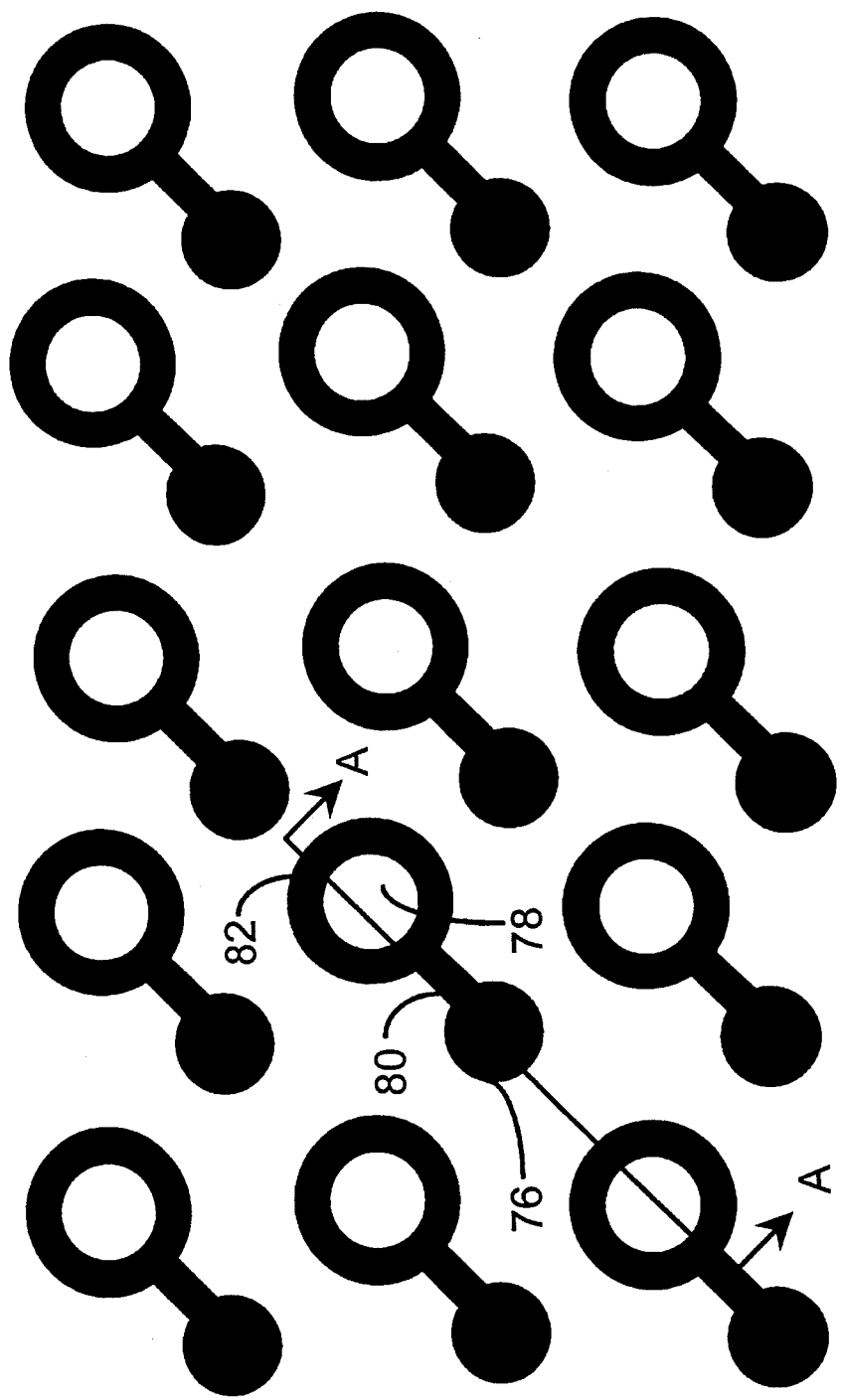
FIG. 5 is a top view of the carrier pad array patterned on the interconnect layer.

FIG. 5 shows a top view of the carrier pad array patterned on the copper interconnect layer on carrier 60 of FIG. 4. As can be seen in FIG. 5, section "A—A" was the cross sectional view shown in FIG. 4. Reference numbers in FIG. 5 correspond to the reference numbers in FIG. 4. Carrier pad 76 is patterned on the interconnect layer of the flexible carrier for bonding with the solder bump on the silicon die. Carrier pads are formed on both sides of the flexible carrier. Thus carrier terminal pad 76 on the upper side of the flexible carrier will have an identical carrier terminal pad 74 on the bottom side of the flexible carrier, which is not visible in FIG. 5, the Top View. Short interconnect trace 80 connects carrier terminal pad 76 to an adjacent through via 78. Via 78 connects topside trace 80 to a similar trace on the bottomside layer (not shown), which connects to carrier terminal pad 74. Via 78 has a collar 82 surrounding it, with collars patterned on both upper and lower interconnect layers. Thus a very short connection is made between upperside layer pad 76 and bottomside layer pad 74 by means of via 78, which is in close proximity to the adjacent carrier terminal pads on both sides.

Vias are preferably located diagonally within the array of carrier terminal pads, about equidistant from the four most adjacent, or closest, carrier terminal pads, which form a box around the via. Carrier terminal pads are preferably located directly opposite one another, with the carrier terminal pad on the upper surface of the flexible carrier directly above the carrier terminal pad on the lower surface of the carrier.

Vias are not located in a stacked arrangement with the carrier terminal pads because of the difficulties in manufacturing such a structure. If the via were located within the carrier pad, the solder bump bonding the carrier pad to the die bonding pad would lie directly above the via. This is undesirable. The problem is that the via will siphon off some of the volume of the solder bump in order to fill the empty volume of the via cylinder formed in the flexible carrier. Thus the volume of solder in the solder bump will be reduced by the volume of the via cylinder. This can cause a process control problem because variations in the volume of the via, which is mechanically punched, can affect the solder bump volume and hence the integrity of the solder-bump bond between the die and the flexible carrier. Process control is simplified by locating the via in a slightly offset position relative to the carrier pad and the solder bump. Since the via will then not be located directly under the solder bump, the via will not siphon off part of the volume of the solder bump. Thus with the offset-via arrangement, process control is simplified because the die attach bond is no longer influenced by the via-punch process.

It is also possible that some of the solder bump could flow through the stacked via and protrude out the opposite side of the flexible carrier, resulting in more loss of solder bump volume, and difficulties in die-attach for the second die. Another alternative is to fill the via cylinder when plating or depositing the conductive layer on the flexible carrier. This is also not satisfactory since the thickness of the conductive layer would have to exactly match the via radius in order to completely fill the via. In addition to restricting the conductor thickness, variations in plating thickness or via-punch could result in pits or bumps from over- or under-filling the via. If the two opposing die are attached simultaneously, then gas may be trapped inside the via when the solder bumps are heated and pressed against the flexible carrier and via. Trapped gas may cause reliability problems for the package. The existing single-die process may be used with only slight modification if the offset-via process, rather than the stacked-via process, is used. Decoupling the solder-bump process step from the via-punch step greatly simplifies process control and manufacturability, and hence reduces cost. Thus the carrier terminal pads must be separated from the via by a short distance, and slightly offset from the via, so that the via does not line up vertically with the carrier terminal pads. This offset-via arrangement will occupy slightly more area than if the vias were stacked inside carrier pads, since the carrier-pad array must be expanded slightly to allow room for the offset vias, but this increase in area is minimal, and is more than compensated for by the simplified processing.

Using a solder array process that has 0.035 millimeter (mm) trace width and 0.043 mm trace spacing, and 0.1 mm vias with a 0.05 mm collar around the via, and solder bump carrier terminal pads of 0.125 mm, a carrier terminal pad pitch of 0.305 mm may be obtained. This allows for more than 700 pads between a pair of opposing die, each die being 8 mm on a side.

Figure 1:
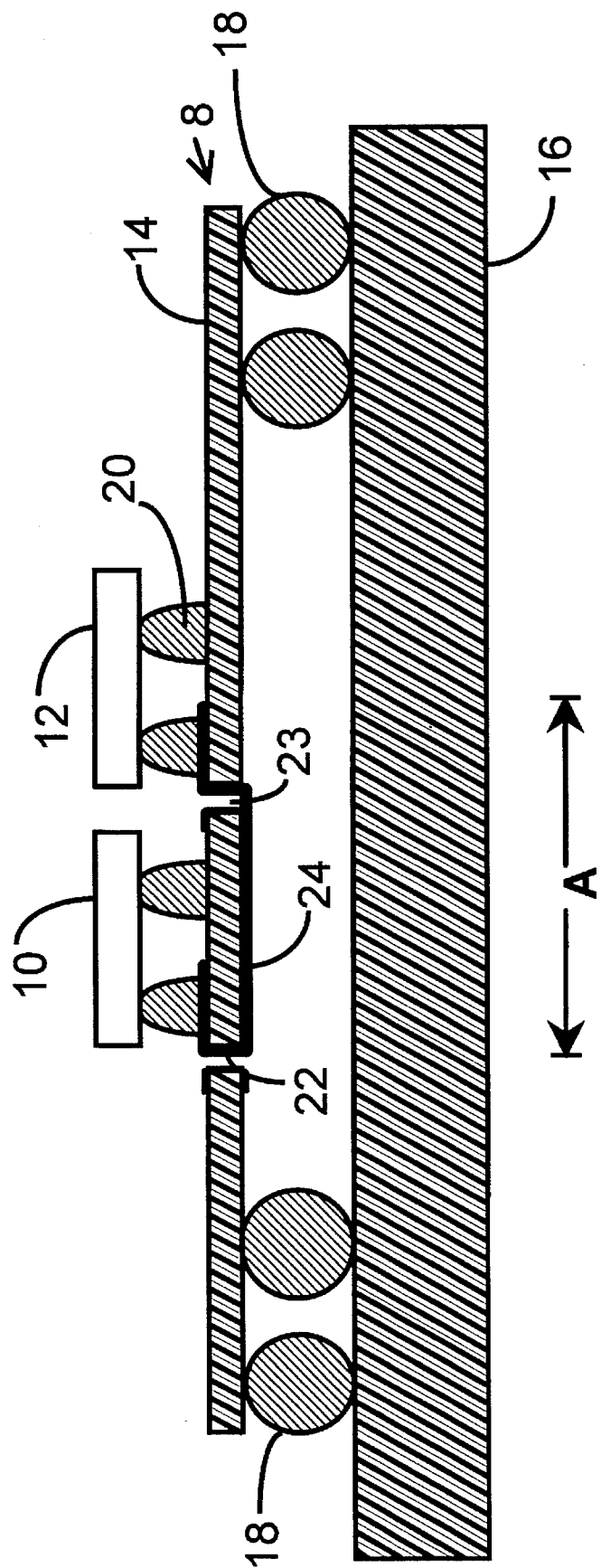
FIG. 1 is a cross-sectional diagram of a prior-art multi chip package using the solder bump technology.

Referring again to FIG. 3, it can be seen that the average interconnect 24A has a distance "B" that is much smaller than the average interconnect 24 distance "A" of the prior art in FIG. 1. Since the prior art requires that the two die lie in the same plane, the average interconnect distance must be greater than the length of a die. Thus an 8 mm die might have an average or typical interconnect distance of 10 mm. In the bi-planar module, because the die lie in two different planes which are parallel to each other, with one above the other, the surfaces of the die having the bonding pads can be located very close to each other. With the bonding pads on the two die close to each other, the interconnect length can be very small. The average interconnect distance using the bi-planar module can be 1–3 times the bonding pad pitch, since vias within the pad array provide interconnect between bonding pads on the two die in close proximity to the pads. Thus a 0.305 mm pitch will result in an interconnect length of 0.3 to 0.9 mm, an order of magnitude smaller than possible in placing die in a side-by-side iso-planar arrangement.

Because of the very short interconnect distance and delays, it may be possible to divide large chips into 2 or more smaller ones packaged in the bi-planar module. Die cost is a function of die size, but it is not a linear function. Cutting a chip into two smaller chips will significantly reduce the cost, even though the total die area is the same, because manufacturing defects cause a non-linear dependence of manufacturing yield on die size. For example, a 10×10 mm die might have a yield of 25%, while splitting the die into two 5×10 mm die will result in each die having a 50% yield. A wafer that had 100 large die or 200 small die would thus produce 200 die×50% =100 small die, or 50 complete 2-chip units, while the larger die would produce 100 die×25% =25 complete 1-chip units. Thus the cost would be cut in half by splitting the large die into two smaller ones.

MANUFACTURING PROCESS

The preferred embodiment may be produced with a process similar to the area array tape-automated-bonding (ATAB) process described more fully in U.S. Pat. No. 5,205,035 and 5,238,176, assigned to International Business Machines of Armonk, N.Y.

The package is manufactured from a 2-metal layer of adhesiveless film or tape. Several packages are made from a long tape in a continuous fashion. The 2 conductive metal layers of the tape are separated by the flexible carrier layer, made from polyimide or a similar dielectric substrate. Vias are mechanically punched through the tape for interconnection of the 2 metal layers. The metal layers are electroplated on the polyimide, which is preferably sputter-seeded. A resist mask is employed to define the metalization. The copper metal layer is typically 0.5 to 1.5 mil thick. A Ni/Au layer is plated over the copper to reduce corrosion and electromigration. The tape may be slit and rolled up on a reel for easy handling.

The outer ring of lead pads, which are used for connection of the package to a PC card, have 10/90 tin/lead solder balls of about 25 mil in size, which are attached to the lead pads with a resistance heating process. The solder ball retains a spherical shape because a discharge welding process is used, which produces well-controlled local heating. A stiffener is attached to the tape opposite the outer ring of lead pads with a film adhesive, such as silicon adhesive and polyimide film.

The die is preferably connected to the package with the well-known C-4 flip-chip process. Solder bumps of 97/3 tin/lead, about 4 mils in diameter, form the connection after pre-heating by simultaneous or gang bonding using a pulse of hot air. An epoxy encapsulant is dispensed on the edges of the die and flows between the die and the tape by capillary action. The encapsulant provides mechanical protection to the solder bump connections.

Die may be attached one at a time to either side of the flexible carrier tape, or they may be attached at the same time. In the first method, the preferred one, die are attached one at a time, with each die using different solder bumps, the bumps having varying melting temperatures. Thus the first die is attached with a higher-melting point solder, while the second die is attached with solder bumps having a somewhat lower melting temperature. Thus the second die is attached at a temperature that melts the solder bumps attached to the second die, but does not melt the solder bumps bonding the first die to the carrier. Precise control of the temperature is achieved by pre-heating the package assembly to slightly below the desired temperature, then applying a pulse of heated air to increase the local temperature to the melting point. A pulse of cold air or nitrogen is then applied to solidify the bond in a controlled manner. The pulse of hot air also serves to apply a slight pressure on the die to push it against the carrier as the solder is melting. The varying melting temperatures of the solder bumps, known as a solder hierarchy, is accomplished by varying the alloy composition, or varying the ratio of tin to lead in the solder bumps. The carrier tape assembly is preferably flipped over after the first die is attached but before the second is attached. This allows the die attach equipment to have the same upward orientation for both die.

A second method to attach two or more die at the same time uses a single temperature and a single solder bump alloy. Each die is pre-aligned to the carrier terminal pads to within about 2 mils, or half a pad diameter. The die, having the solder bump already attached, is held in place to the carrier pads by a sticky paste flux such as common soldering flux. All die are pre-aligned and attached and held in place by the paste flux without melting the solder bumps. The carrier may be flipped over during this procedure in order to place the bottom die on the carrier. The assembly is then preheated to just below the melting point of the solder bumps, and then a pulse of hot air is applied to reach the melting temperature, which allows the solder bumps to re-flow. Two or more nozzles for the hot air may be used, one above each die, to provide slight pressure on the die toward the carrier. Capillary action of the solder bumps as they are re-flowed will provide the final alignment of the die to the carrier terminal pads; the capillary action "pulling" the die into alignment, because the surface area of the solder bumps is at a minimum when the die and carrier pads are aligned, whereas mis-aligned pads will require an elongated solder bump with a larger surface area.

A heat sink may then be attached to the top die. The heat sink may extend around the outer ring of lead pads, and be attached to the carrier or stiffener with adhesive, or the heat sink may be attached only to the top die. When only attached to the top die, the ability of the carrier to flex is important as the relatively large heat sink may move relative to the rest of the package upon heating or cooling. Thus the flexible carrier allows the die and heat sink to move slightly relative to the rest of the package. A rigid carrier could crack or otherwise be damaged.

ALTERNATE EMBODIMENTS

Several other embodiments are contemplated by the inventors. For example, in the preferred embodiment the top and bottom carrier pads line up vertically in a co-linear arrangement. However, the carrier pads could be offset slightly to one another and still achieve the short interconnect length. Also, the carrier terminal pads of one layer could be lined up under those of the other layer, yet the via could electrically connect to one of the other three carrier terminal pads that are equidistant from the via, and still achieve the short interconnect distance. While the array of die bonding pads of the two die are illustrated as being mirror-images of one another, slight differences would be possible, for example some of the pads may be used for I/O external to the package and thus the short interconnect length is not possible for these I/O since these I/O connect outside the package to the PC card. However, some of the bonding pads must lie in an array that will correspond to the same I/O signals of the other chip, so that the short interconnect distance is possible. While most vias are contemplated adjacent, and in close proximity to the carrier terminal pads, some could be located farther away.

Figure 6:
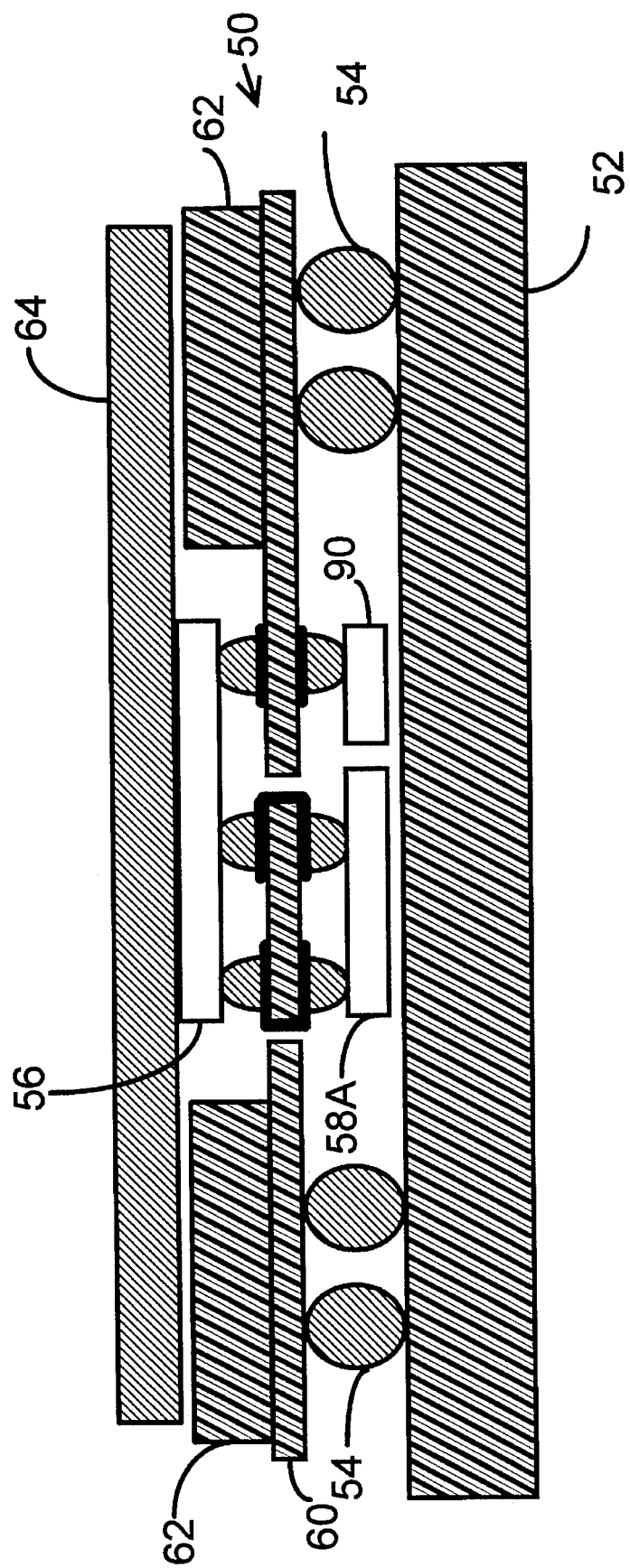
FIG. 6 is a cross sectional view of the module having more than one bottom die.
Figure 7:
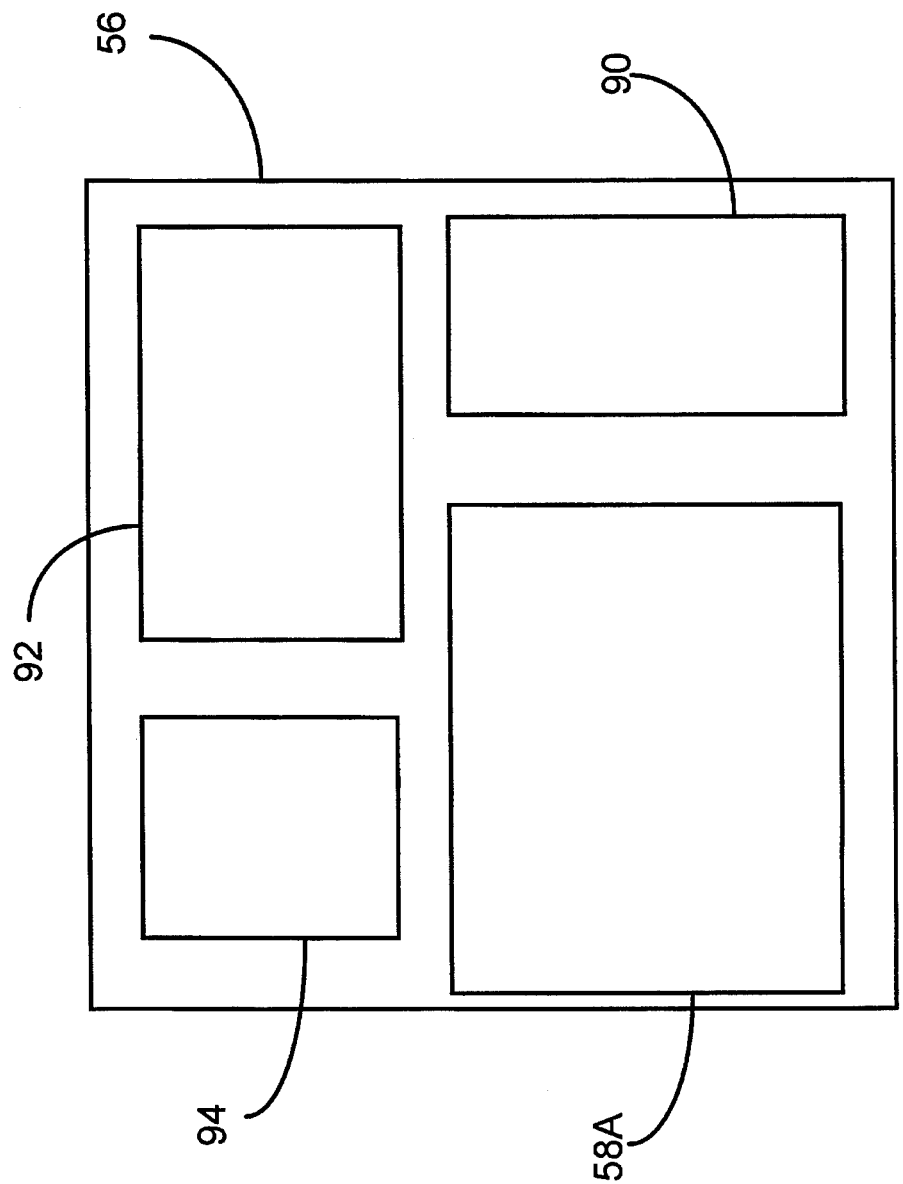
FIG. 7 is a top view of the top and bottom die in the module.

Another contemplated embodiment has a single upper die but several lower die directly underneath the upper die. FIG. 6 shows a view similar to FIG. 3, but with a third die 90 also attached to the underside of flexible carrier 60, next to die 58A, also attached to the bottom of the flexible carrier. The lower die 90, 58A are smaller in area than the upper die; for example one large upper die could be bonded to 2 lower die, with each of the lower die being about half the size of the upper die. FIG. 7 shows a top view where several bottom die 90, 58A, 92, 94 occupy the same area as the single larger die 56. Of course, top die 56 could likewise be split into several smaller die.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A package for a plurality of integrated circuits comprising:

a top die having bonding pads on an active area facing downwardly;

a bottom die having bonding pads on an active area facing upwardly;

a sheet of insulating carrier having a top conductive layer and a bottom conductive layer, the conductive layers having a pattern of carrier terminal pads and interconnect formed therein, the sheet having through-vias electrically connecting carrier terminal pads on the top, conductive layer to carrier terminal pads on the bottom conductive layer;

top bonding means, attached to the bonding pads on the top die for bonding to the carrier terminal pads on the top conductive layer;

bottom bonding means, attached to the bonding pads on the bottom die for bonding to the carrier terminal pads on the bottom conductive layer; and an overlapping portion of the sheet, the overlapping portion between the top die and the bottom die, the overlapping portion having carrier terminal pads on the top conductive layer bonded to bonding pads on the top die and carrier terminal pads on the bottom conductive layer bonded to bonding pads on the bottom die, the overlapping portion having through-vias connecting the carrier terminal pads on the top conductive layer with the carrier terminal pads on the bottom conductive layer, the through-vias slightly offset from and in close proximity to the connected carrier terminal pads, wherein the carrier terminal pads on the conductive layers form an array having rows and columns of carrier terminal pads, the array having the vias located between carrier terminal pads, the vias connecting an adjacent carrier terminal pad on the top conductive layer with an adjacent carrier terminal pad on the bottom conductive layer, the vias in the array located on a diagonal to the rows and columns of carrier terminal pads.

2. The package of claim 1 wherein the adjacent carrier terminal pad on the top conductive layer is electrically connected with an adjacent carrier terminal pad on the bottom conductive layer through an adjacent via, the top adjacent carrier terminal pad directly above the bottom adjacent carrier terminal pad.

3. A package for a plurality of integrated circuits comprising:

a top die having bonding pads on an active area facing downwardly;

a bottom die having bonding pads on an active area facing upwardly;

a sheet of insulating carrier having a top conductive layer and a bottom conductive layer, the conductive layers having a pattern of carrier terminal pads and interconnect formed therein, the sheet having through-vias electrically connecting carrier terminal pads on the top conductive layer to carrier terminal pads on the bottom conductive layer;

top bonding means, attached to the bonding pads on the top die for bonding to the carrier terminal pads on the top conductive layer:

bottom bonding means attached to the bonding pads on the bottom die for bonding to the carrier terminal pads on the bottom conductive layer;

an overlapping portion of the sheet, the overlapping portion between the top die and the bottom die, the overlapping portion having carrier terminal pads on the top conductive layer bonded to bonding pads on the top die and carrier terminal pads on the bottom conductive layer bonded to bonding pads on the bottom die, the overlapping portion having through-vias connecting the carrier terminal pads on the top conductive layer with the carrier terminal pads on the bottom conductive layer, the through-vias slightly offset from and in close proximity to the connected carrier terminal pads, at least one of the through-vias being closer to adjacent carrier terminal pads than the carrier terminal pads are to adjacent carrier terminal pads;

an outer ring of lead pads, surrounding the die and vias, for connection to a printed circuit card; and outer bonding means, attached to the outer ring of lead pads, for bonding between the lead pads and the printed circuit card.

4. The package of claim 3 further comprising a stiffener, situated above the outer ring, for providing rigid support to the outer ring of lead pads.

5. The package of claim 4 further comprising a heat sink, attached to the top die, for dissipating heat generated by the top die and heat generated by the bottom die.

6. The package of claim 4 wherein the top bonding means and the bottom bonding means comprises a solder bump attached to a bonding pad and a carrier terminal pad.

7. The package of claim 4 wherein the carrier is flexible.

8. A bi-planar multi-chip module comprising:

a first die having die bonding pads facing downwardly;

a second die having die bonding pads facing upwardly;

a flexible carrier having carrier terminal pads on upper and lower surfaces, the first die attached to the upper surface of the carrier and the second die attached to the lower surface of the carrier;

first bonding means, disposed between the die bonding pads on the first die and the carrier terminal pads on the upper surface, for electrical and mechanical bonding therebetween;

second bonding means, disposed between the die bonding pads on the second die and the carrier terminal pads on the lower surface, for electrical and mechanical bonding therebetween; and vias on the carrier, for connecting carrier terminal pads on the upper surface to carrier terminal pads on the lower surface, the vias located adjacent to carrier terminal pads on the upper and lower surfaces and between the first and second die, the vias and carrier terminal pads on the upper and lower surfaces arranged in a two-dimensional array, having rows and columns of carrier terminal pads, with a via located between carrier terminal pads on a diagonal to the rows and columns of carrier terminal pads, whereby electrical connection is made between the first die and the second die through vias adjacent to the bonding pads on the first die and on the second die.

9. The module of claim 8 wherein carrier terminal pads on the upper surface are directly opposite carrier terminal pads on the lower surface.

10. A bi-planar multi-chip module comprising:

a first die having die bonding pads facing downwardly:

a second die having die bonding pads facing upwardly:

a flexible carrier having carrier terminal pads on upper and lower surfaces the first die attached to the upper surface of the carrier and the second die attached to the lower surface of the carrier:

first bonding means, disposed between the die bonding pads on the first die and the carrier terminal pads on the upper surface for electrical and mechanical bonding therebetween:

second bonding means, disposed between the die bonding pads on the second die and the carrier terminal pads on the lower surface, for electrical and mechanical bonding therebetween:

vias on the carrier, for connecting carrier terminal pads on the upper surface to carrier terminal pads on the lower surface, the vias located adjacent to carrier terminal pads on the upper and lower surfaces and between the first and second die, the carrier terminal pads arranged in a two-dimensional array having rows and columns of carrier terminal pads with the vias located between carrier terminal pads on a diagonal to the rows and columns of carrier terminal pads; and a third die having die bonding pads facing upwardly, the third die attached to the lower surface of the carrier;

whereby electrical connection is made between the first die and the second die and between the first die and the third die through vias adjacent to the bonding pads on the first die and on the second die.

11. The bi-planar multi-chip module of claim 10 wherein the vias in the two-dimensional array are located about equidistant from the four most adjacent carrier terminal pads on the upper and lower surfaces.

12. The bi-planar multi-chip module of claim 10 wherein the carrier is flexible.

13. The bi-planar multi-chip module of claim 10 wherein the first bonding means and the second bonding means comprise a solder bump attached to a bonding pad and a carrier terminal pad.

* * * * *